United States Patent
Cho et al.

(10) Patent No.: US 8,274,317 B2
(45) Date of Patent: Sep. 25, 2012

(54) PHASE-LOCKED LOOP CIRCUIT COMPRISING VOLTAGE-CONTROLLED OSCILLATOR HAVING VARIABLE GAIN

(75) Inventors: Sang Hyun Cho, Daejeon (KR); Hui Dong Lee, Daejeon (KR); Kwi Dong Kim, Daejeon (KR); Jong Kee Kwon, Daejeon (KR); Seung Tak Ryu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 120 days.

(21) Appl. No.: 12/882,132

(22) Filed: Sep. 14, 2010

(65) Prior Publication Data

US 2011/0148485 A1    Jun. 23, 2011

(30) Foreign Application Priority Data

Dec. 21, 2009  (KR) .................. 10-2009-0128042
Apr. 9, 2010   (KR) .................. 10-2010-0032656

(51) Int. Cl.
 *H03L 7/06* (2006.01)
(52) U.S. Cl. ...................... 327/156; 327/147
(58) Field of Classification Search .............. 327/148, 327/157
See application file for complete search history.

(56) References Cited

U.S. PATENT DOCUMENTS

| | | | |
|---|---|---|---|
| 4,686,560 A | 8/1987 | Balaban et al. | |
| 2006/0208806 A1 | 9/2006 | Chien | |
| 2007/0249293 A1* | 10/2007 | Chae et al. | 455/76 |
| 2008/0225176 A1* | 9/2008 | Selby et al. | 348/572 |
| 2009/0002079 A1* | 1/2009 | Venuti et al. | 331/10 |
| 2009/0058536 A1 | 3/2009 | Gomez | |
| 2009/0219100 A1* | 9/2009 | Pullela et al. | 331/44 |
| 2009/0289723 A1* | 11/2009 | Maeda et al. | 331/15 |
| 2010/0171535 A1* | 7/2010 | Shanan | 327/157 |
| 2011/0133799 A1* | 6/2011 | Dunworth et al. | 327/157 |
| 2012/0049913 A1* | 3/2012 | Tadjpour | 327/157 |

FOREIGN PATENT DOCUMENTS

KR    1020080097528 A    11/2008

OTHER PUBLICATIONS

Chun-Ming Hsu et al., "A Low-Noise, Wide-BW 3.6GHz Digital ΔΣ Fractional-N Frequency Synthesizer with a Noise-Shaping Time-to-Digital Converter and Quantization Noise Cancellation", International Solid-State Circuits Conference, 2008, pp. 340-341, 617, vol. 19, No. 1, IEEE.

* cited by examiner

*Primary Examiner* — Lincoln Donovan
*Assistant Examiner* — Adam Houston

(57) ABSTRACT

A phase-locked loop (PLL) circuit including a voltage-controlled oscillator (VCO) with a variable gain is provided. A phase frequency detector (PFD) detects a phase difference between a reference signal and a PLL feedback signal. A charge pump and a loop filter sequentially process an output signal of the PFD. A VCO has different gains according to a mode transition. A control voltage applied to the VCO is selected from an output signal of the loop filter and an additional control signal according to the mode transition.

14 Claims, 4 Drawing Sheets

PHASE-LOCKED LOOP CIRCUIT COMPRISING VOLTAGE-CONTROLLED OSCILLATOR HAVING VARIABLE GAIN

CROSS-REFERENCE TO RELATED APPLICATION

This application claims priority to and the benefit of Korean Patent Application No. 10-2009-0128042, filed Dec. 21, 2009, and Korean Patent Application No. 10-2010-0032656, filed Apr. 9, 2010, the disclosure of which is incorporated herein by reference in its entirety.

BACKGROUND

1. Field of the Invention

The present invention relates to a phase-locked loop (PLL) circuit including a voltage-controlled oscillator (VCO) having a variable gain and, more particularly, to a PLL circuit in which a VCO has different gains according to a mode transition to ensure a wide operating frequency and improve a phase noise characteristic.

2. Discussion of Related Art

In general, a phase-locked loop (PLL) circuit is a frequency feedback circuit configured to generate a signal having an arbitrary frequency in response to the frequency of an externally applied signal. The PLL circuit may detect a phase difference between a reference signal and an oscillation signal and synchronize phases in response to an up-down signal corresponding to the detected phase difference such that the oscillation signal has a desired frequency. The PLL circuit may be widely used for semiconductor integrated circuits (ICs), such as memory devices, frequency synthesis circuits, or clock recovery circuits of data processing circuits.

A typical PLL circuit may include a phase frequency detector (PFD), a charge pump, a loop filter, and a voltage-controlled oscillator (VCO). The PFD may detect a phase difference between a reference signal and an oscillation signal fed back from the VCO. The charge pump may output charges corresponding to an output signal of the PFD. The loop filter may filter a high-frequency component of an output signal of the charge pump and apply a control voltage to the VCO. The VCO may generate an oscillation signal having a frequency corresponding to the control voltage of the loop filter.

There are many considerations in designing the PLL circuit. A power supply voltage of the PLL circuit may be the most important consideration caused by the development of complementary metal-oxide semiconductor (CMOS) technology. That is, as the power supply voltage of the PLL circuit decreases, a tuning range of the PLL circuit may be further limited. Typical methods used in efforts to solve the above-described problem include a method of increasing the number of capacitor banks included in a VCO and controlled by a digital code, a method of employing two different inductors, and a method of expanding a variable range of a resonance frequency by allowing a VCO to have a large gain.

However, when the number of the capacitor banks is increased, the entire designed area may be increased, and a VCO may exhibit a nonlinear characteristic according to the number of capacitor banks. Also, when a large number of capacitor banks are provided, a parasitic capacitor and a leakage current may be caused to the output of the VCO, thereby reducing a Q-value. Meanwhile, when the number of inductors is increased, the designed area may be limited, and the use of the VCO with a large gain may worsen noise characteristics of the PLL circuit. A gain of the VCO may be expressed by a variation in the output frequency of the VCO relative to a variation in the control voltage of the PLL circuit. Thus, as the variation in the frequency of the VCO increases in response to a fixed control voltage, the entire VCO may increase. That is, when the VCO has a great gain, the frequency of the VCO may be greatly varied due to noises of the control voltage of the PLL circuit, thereby adversely affecting the noise characteristics of the PLL circuit.

SUMMARY OF THE INVENTION

The present invention is directed to a phase-locked loop (PLL) circuit in which a voltage-controlled oscillator (VCO) has different gains according to a mode transition so that the PLL circuit may ensure a wide operating frequency and an improved phase noise characteristic.

Also, the present invention is directed to a PLL circuit configured to increase a tuning range without increasing the number of capacitor banks to reduce a designed area and improve the performance of the entire circuit.

One aspect of the present invention provides a PLL circuit including: a phase frequency detector (PFD) configured to detect a phase difference between a reference signal and a PLL feedback signal; a charge pump and a loop filter configured to sequentially process an output signal of the PFD; and a VCO configured to have different gains according to a mode transition. A control voltage applied to the VCO is selected from an output signal of the loop filter and an additional control signal according to the mode transition.

The mode transition may be made after the PLL circuit is locked in a first mode.

The PLL circuit may further include: an analog-to-digital converter (ADC) configured to convert the output signal of the loop filter into a digital signal; and a digital-to-analog converter (DAC) configured to convert the output digital signal of the ADC into an analog signal. The additional control signal may be the output signal of the DAC.

The PLL circuit may further include a register configured to store the output signal of the ADC and provide the output signal of the ADC to the DAC.

The PLL circuit may further include a switch configured to make the mode transition. When the switch is in a first position, only the output signal of the loop filter may be applied as the control voltage of the VCO, and when the switch is in a second position, the output signal of the loop filter and the additional control signal may be applied as the control voltage of the VCO.

The switch may make the transition from the first position to the second position after the PLL circuit is locked.

The VCO may include at least one device that exhibits different characteristics in response to the applied control voltage.

The at least one device may include: at least one first device configured to always receive the output signal of the loop filter as the control voltage irrespective of the mode transition; and at least one second device configured to receive the output signal of the loop filter or the additional control signal as the control signal according to the mode transition.

The at least one device may include at least one selected from a variable capacitor, a varactor and a transistor.

The gain of the VCO may be expressed as a variation in an oscillation frequency of the VCO relative to a variation in the output signal of the loop filter.

BRIEF DESCRIPTION OF THE DRAWINGS

The above and other features and advantages of the present invention will become more apparent to those of ordinary

DETAILED DESCRIPTION OF EMBODIMENTS

The present invention will now be described more fully hereinafter with reference to the accompanying drawings, in which exemplary embodiments of the invention are shown. Descriptions of well-known components and processing techniques are omitted so as not to unnecessarily obscure the embodiments of the present invention.

Embodiment

Configuration of a Phase-locked Loop (PLL) Circuit

Figure 1:
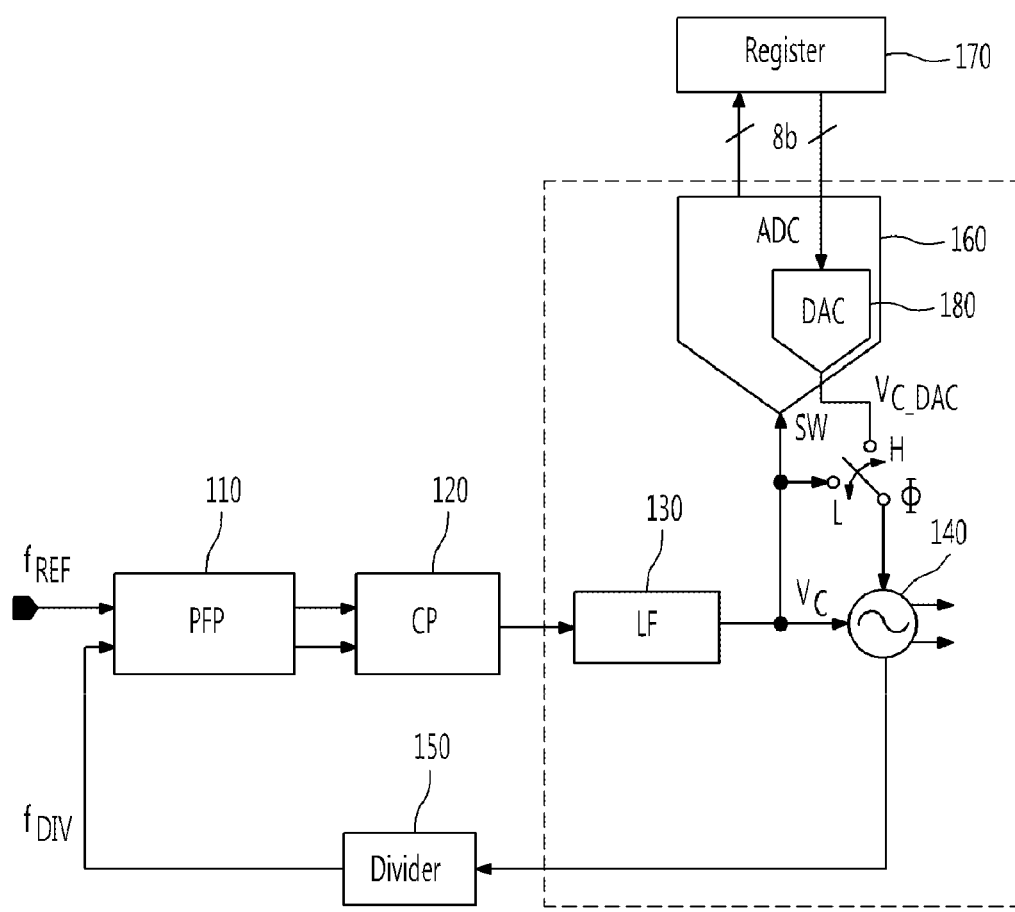
FIG. 1 is a block diagram showing the entire configuration of a phase-locked loop (PLL) circuit according to an exemplary embodiment of the present invention.

FIG. 1 is a block diagram of the entire configuration of a PLL circuit according to an exemplary embodiment of the present invention.

Referring to FIG. 1, a PLL circuit according to the present invention may have a basic loop including a phase frequency detector (PFD) 110, a charge pump (CP) 120, a loop filter (LF) 130, a voltage-controlled oscillator (VCO) 140, and a divider 150.

Also, the PLL circuit may further include an analog-to-digital converter (ADC) 160, a register 170, and a digital-to-analog converter (DAC) 180. The ADC 160 may receive an output voltage $V_C$ of the loop filter 130. The register 170 may store a digital code, which is an output value of the ADC 160. The DAC 180 may receive the digital code stored in the register 170.

Meanwhile, the PLL circuit may further include a switch SW, which may allow one of the output signal $V_C$ of the loop filter 130 and an output signal $V_{C\_DAC}$ of the DAC 180 to be applied to the VCO 140.

The PFD 110 may receive a reference signal having a predetermined reference frequency $f_{REF}$ and an output signal of the divider 150, which has a division frequency $f_{DIV}$, detect a phase difference between the reference signal and the output signal of the divider 150, and output the detection signal as an output signal. When the reference frequency $f_{REF}$ is about the same as the division frequency $f_{DIV}$, the output signal of the PFD 110 may be zero(0), and when the reference frequency $f_{REF}$ is not the same as the division frequency $f_{DIV}$, the output signal of the PFD 110 may be non-zero.

The charge pump 120 may pump charges in response to the output signal of the PFD 110 and increase the magnitude of the output signal of the PFD 110. Specifically, the output signal of the PFD 110 may have a predetermined voltage. The charge pump 120 may boost the voltage of the output signal within a predetermined range of, for example, twice the voltage of the output signal, and output the output signal with the boosted voltage.

Meanwhile, the loop filter 130 may function as a low-pass filter (LPF), which may filter a high-frequency component generated during a loop operation. Also, the loop filter 130 may apply a signal $V_C$ corresponding to the amount of charges provided by the charge pump 120 to the VCO 140 using a variation in the amount of charges accumulated in at least one capacitor included in the loop filter 130.

The VCO 140 may output an oscillation signal having a predetermined frequency corresponding to a control voltage $V_C$ output from the loop filter 130. The VCO 140 may operate based on the control voltage $V_C$ output from the loop filter 130. For example, the VCO 140 may output a signal having a low frequency in response to a low control voltage $V_C$, while the VCO 140 may output a signal having a high frequency in response to a high control voltage $V_C$.

The divider 150 may divide a frequency $f_{out}$ of the output signal of the VCO 140 by an integer N and generate a feedback signal having a predetermined division frequency $f_{div}$. Since the divider 150 divides only the frequency $f_{out}$, the feedback signal, which is the output signal of the divider 150, may have about the same amplitude as the output signal of the VCO 140 and a frequency $f_{div}$ lower than the frequency $f_{out}$ due to a factor N. The output feedback signal may be applied to the PFD 110 along with the reference signal having the reference frequency $f_{REF}$.

Hereinafter, operation of the entire PLL circuit according to the position of the switch SW will be described in detail.

Operation of PLL Circuit

The PLL circuit according to the embodiment may operate in two different modes according to the position of the switch SW. The switch SW may be embodied by a typical switch, such as a transistor or a mechanical switch. Hereinafter, it is assumed for brevity that the operation of the switch SW is controlled in response to a predetermined control signal.

To begin with, when the switch SW is connected to a low (L) position in response to a control signal, the PLL circuit according to the present invention may have a loop configured as follows. That is, the PLL circuit according to the present invention may have a basic operation loop including the PFD 110, the charge pump 120, the loop filter 130, the VCO 140, and the divider 150. In this case, both input signals configured to control the VCO 140 may become the output signals $V_C$ of the loop filter 130. Thus, the output signal of the DAC 180 may not affect the entire PLL circuit. The above-described operation of the PLL circuit may be referred to as a coarse locking mode.

Meanwhile, when the switch SW is connected to a high (H) position in response to the control signal, the PLL circuit according to the present invention may have a loop configured as follows. That is, the PLL circuit according to the present invention may have a basic operation loop including the PFD 110, the charge pump 120, the loop filter 130, the VCO 140, and the divider 150 and may further have a loop including the ADC 160, the register 170, and DAC 180. The ADC 160 may receive the output signal $V_C$ of the loop filter 130. The register 170 may store the output signal of the ADC 160. The DAC 180 may convert a value stored in the register 170 into an analog signal and transmit the analog signal to the VCO 140. The above-described operation of the PLL circuit may be referred to as a fine locking mode. In the fine locking mode, only one of input voltages configured to control the VCO 140 may be controlled by the loop filter 130, while the other may be controlled in response to a voltage generated by a digital code stored in the register 170 as the output signal of the DAC 180.

Figure 2:
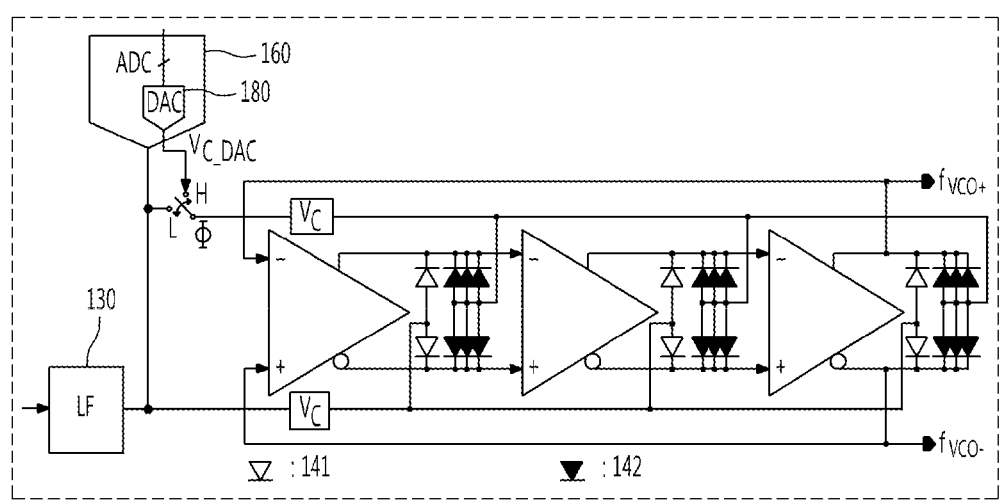
FIG. 2 is a detailed circuit diagram of a portion of the PLL circuit of FIG. 1, which is illustrated with a dashed line.

FIG. 2 is a detailed circuit diagram of a portion of the PLL circuit of FIG. 1, which is illustrated with a dashed line.

Referring to FIG. 2, the VCO 140 according to the embodiment may include at least one stage. Also, as described above, a frequency of an oscillation signal output by the VCO 140 may depend on an applied control voltage. Specifically, the characteristics (e.g., impedance or capacitance) of the VCO 140 may depend on the control voltage, and an oscillation frequency of the output signal of the VCO 140 may be varied according to the characteristics of the VCO 140. As a result, the VCO 140 may include a varactor, a transistor serving as a load, or various other devices, such as a variable capacitor or resistor, which exhibit different characteristics in response to a control voltage to vary the oscillation frequency of the VCO 140. Hereinafter, it is assumed that the VCO 140 includes varactors 141 and 142, which exhibit different characteristics in response to the control voltage.

As stated above, two control voltages used to control the oscillation frequency of the VCO 140 may be output signals $V_C$ of the loop filter 130. Alternatively, one of the control voltages used to control the oscillation frequency of the VCO 140 may be an output signal $V_C$ of the loop filter 130, while the other may be an output signal $V_{C\_DAC}$ of the DAC 180. In FIG. 2, the varactor 141 may always be controlled in response to the output signal $V_C$ of the loop filter 130 irrespective of the position of the switch SW, and the varactor 142 may be controlled in response to the output signal $V_C$ of the loop filter 130 when the switch SW is in an L position, and controlled in response to the output signal $V_{C\_DAC}$ of the DAC 180 when the switch SW is in an H position. Although FIG. 2 exemplarily illustrates three varactors 142, the present invention is not limited thereto and at least one varactor 142 will suffice. Also, the at least one varactor 142 may be replaced by another variable device (e.g., a variable capacitor) configured to exhibit other characteristics in response to a control voltage $V_C$ or $V_{C\_DAC}$.

Figure 3A:
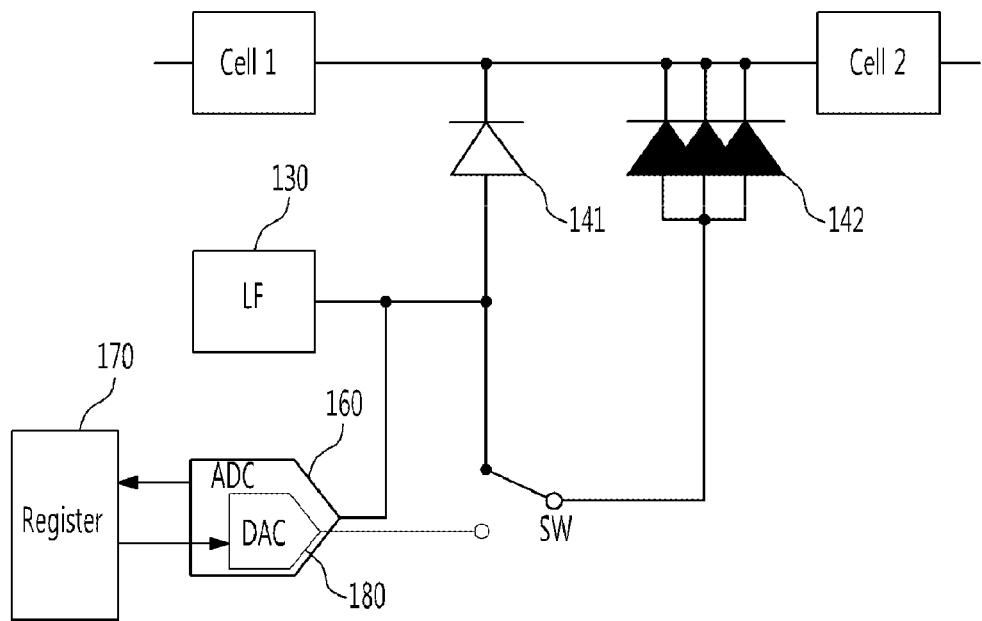
FIGS. 3A and 3B are circuit diagrams showing connection of circuits according to the position of a switch in the PLL circuit of FIG. 1.
Figure 3B:
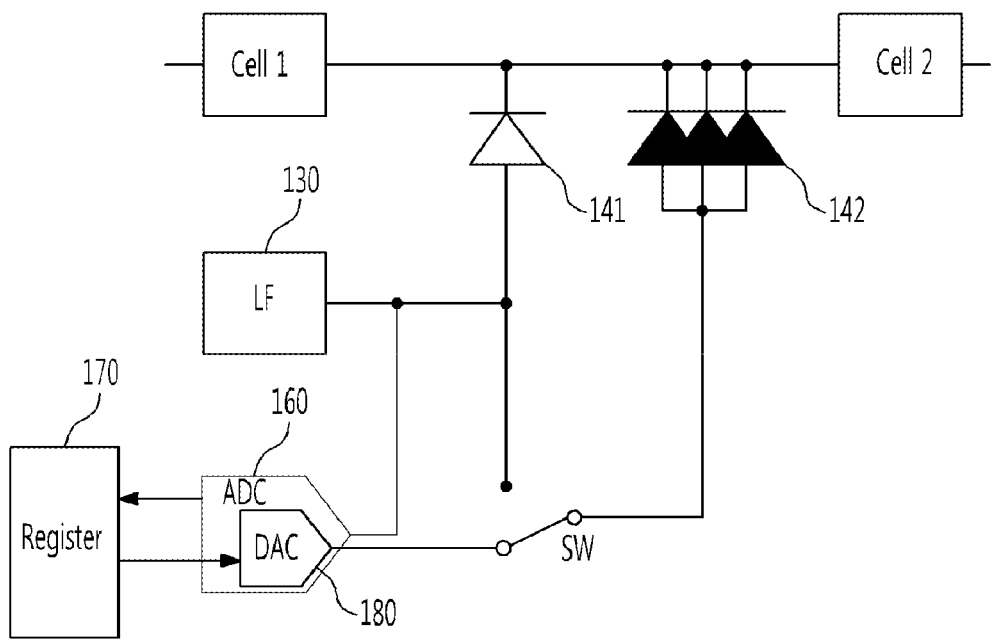

FIGS. 3A and 3B are circuit diagrams of the PLL circuit of FIG. 1 in which switches SW are in an L position and an H position, respectively. Referring to FIG. 3A, when the switch SW is in the L position, all varactors 141 and 142 included in the VCO 140 may be controlled in response to an output signal $V_C$ of the loop filter 130. In this case, the output signal $V_C$ of the loop filter 130 may be converted into a digital signal by the ADC 160 and stored in the register 170. Meanwhile, as shown in FIG. 3B, when the switch SW is in the H position, the varactor 141 may be controlled in response to the output signal $V_C$ of the loop filter 130, while the varactor 142 may be controlled in response to the output signal $V_{C\_DAC}$ of the DAC 180. In this case, the digital signal $V_C$ of the loop filter 130, which may be stored in the register 170, may be converted into an analog signal by the DAC 180 again and used as a control voltage of the varactor 142.

An oscillation frequency of the VCO 140 according to an embodiment may be defined as shown in the following Equation 1:

$$\omega_{OSC} = \frac{1}{2NR_{load}C_{load}}, \quad (1)$$

where N is the number of stages of the VCO 140, and $R_{load}$ and $C_{load}$ denote the total resistance and the total capacitance, respectively, which are output from each stage of the VCO 140.

A gain $K_{VCO}$ of the VCO 140 may be obtained by differentiating the oscillation frequency $\omega_{OSC}$ with respect to an internal control voltage. Since the internal control voltage becomes the output $V_C$ of the loop filter 130, the gain $K_{VCO}$ may be expressed as shown in Equation 2:

$$K_{VCO} = \frac{\partial \omega_{ox}}{\partial V_C} \quad (2)$$
$$= -\frac{1}{2NR_{load}C_{load}^2} \cdot \frac{\partial C_{load}}{\partial V_C}$$
$$= -\alpha \cdot \frac{\partial C_{load}}{\partial V_C} [\text{rad}/(\text{sec} \cdot \text{V})].$$

Here, the value $C_{load}$ may depend on a mode. Initially, the value $C_{load}$ obtained in a coarse locking mode may be expressed as shown in Equation 3:

$$C_{load} = C_{parasitics} + 4C_{VAR}(V_C) \quad (3),$$

where $C_{parastics}$ denotes a parasitic capacitance of the VCO 140, and $C_{VAR}(V_C)$ denotes a capacitance of the varactors 141 and 142 controlled in response to the output signal $V_C$ of the loop filter 130. Since the PLL circuit is in the coarse locking mode, all the varactors 141 and 142 of the VCO 140 may be controlled in response to the output signal $V_C$ of the loop filter 130, and the value $C_{load}$ may be expressed as shown in Equation 3. The gain $K_{VCO}$ of the VCO 140 may be expressed using the value $C_{load}$ as shown in Equation 4:

$$K_{VCO} = 4\alpha \cdot \frac{\partial C_{VAR}}{\partial V_C}. \quad (4)$$

Meanwhile, the value $C_{load}$ obtained in the fine locking mode may be expressed as shown in Equation 5:

$$C_{load} = C_{parasitics} + C_{VAR}(V_C) + 3C_{VAR}(V_{C\_DAC}) \quad (5),$$

where $C_{VAR}(V_C)$ denotes the capacitance of the varactor 141 controlled in response to the output signal $V_C$ of the loop filter 130, and $C_{VAR}(V_{C\_DAC})$ denotes the capacitance of the varactor 142 controlled in response to the output signal $V_{C\_DAC}$ of the DAC 180. Since the PLL circuit is in the fine locking mode, the varactor 141 may be controlled in response to the output signal $V_C$ of the loop filter 130, while the varactor 142 may be controlled in response to the output signal $V_{C\_DAC}$ of the DAC 180. The gain $K_{VCO}$ of the VCO 140 may be expressed using the value $C_{load}$ as shown in Equation 6:

$$K_{VCO} = \alpha \cdot \frac{\partial C_{VAR}}{\partial V_C}. \quad (6)$$

Since the terms other than $C_{VAR}(V_C)$ are constants with respect to $V_C$ in Equation 5, the result as shown in Equation 6 may be obtained.

Referring to Equations 4 and 6, it may be seen that the gain $K_{VCO}$ of the VCO 140 in the fine locking mode may be one fourth of the gain of the VCO 140 in the coarse locking mode.

Figure 4A:
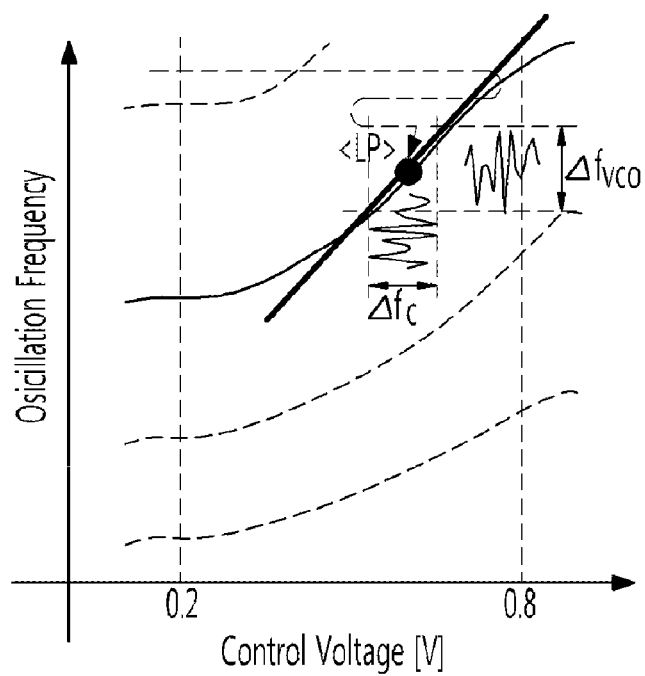
FIGS. 4A and 4B are graphs showing an oscillation frequency relative to a control voltage of a voltage-controlled oscillator (VCO) in a coarse locking mode and a fine locking mode, respectively.
Figure 4B:
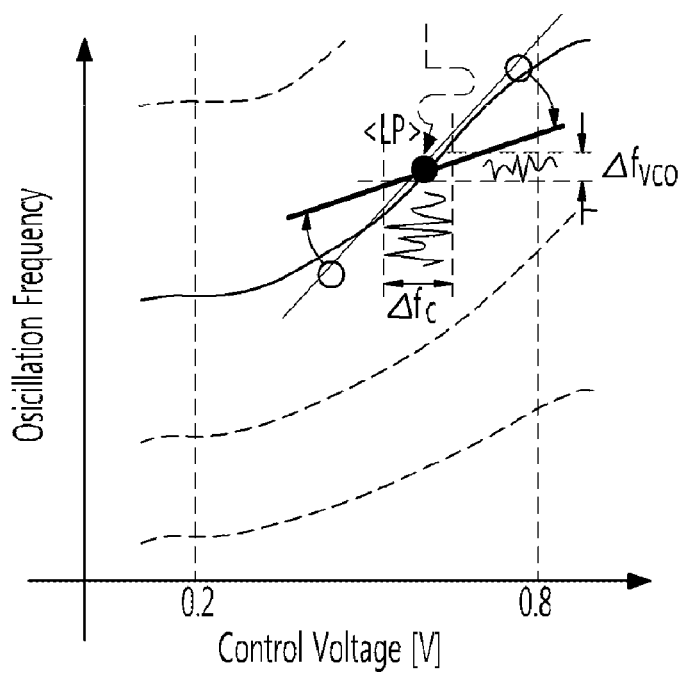

FIGS. 4A and 4B are graphs showing an oscillation frequency relative to a control voltage $V_C$ of a VCO in a coarse locking mode and a fine locking mode, respectively.

As described above, a value obtained by differentiating the oscillation frequency with respect to the internal control voltage $V_C$ is a gain $K_{VCO}$ of the VCO 140. Thus, in FIGS. 4A and 4B, a variation $\Delta f_{VCO}$ in the oscillation frequency relative to a variation $\Delta V_C$ of the control voltage $V_C$ may become the gain $K_{VCO}$ of the VCO 140. Referring to FIGS. 4A and 4B, it can be seen that a gain $K_{VCO}$ obtained at a locking point LP in the coarse locking mode may be greater than a gain $K_{VCO}$ obtained at the locking point LP in the fine locking mode. In the VCO 140, a ratio of the gain $K_{VCO}$ obtained in the coarse locking mode to the gain $K_{VCO}$ obtained in the fine locking mode may be determined by the number of varactors 141, which are always controlled only in response to the output voltage $V_C$ of the loop filter 130, and the number of varactors 142, which are selectively controlled in response to the output voltage $V_C$ of the loop filter 136 or the output signal $V_{C\_DAC}$ of the DAC 180 according to the position of the switch SW. For example, when the VCO 140 includes one varactor 141 and three varactors 142, although the gain $K_{VCO}$ obtained in the coarse locking mode may be four times the gain $K_{VCO}$ obtained in the fine locking mode, a gain ratio of the coarse locking mode to the fine locking mode may be controlled by appropriately adjusting the numbers of the varactors 141 and 142. It seems as if both the varactors 141 and 142 are seen from an output terminal of the loop filter 130 in the coarse locking mode, while only the varactor 141, which is controlled in the output voltage $V_C$ of the loop filter 130, is seen from the output terminal of the loop filter 130 in the fine locking mode.

When the PLL circuit makes the transition from the coarse locking mode to the fine locking mode, the gain $K_{VCO}$ of the VCO 140 may be reduced to improve phase noise characteristics. Meanwhile, a great gain $K_{VCO}$ obtained in the coarse locking mode may allow the PLL circuit to ensure a wide operation frequency.

Although embodiments describe that mode transition is made by switching a control voltage required to control the varactors 141 and 142 included in the VCO 140, the present invention is not limited thereto. Any kind of mode transition may be included within the spirit and scope of the present invention. Also, any circuit configuration embodied to vary a gain of the VCO 140 according to mode transition may be included in the scope of the invention. For example, according to the present invention, a metal-oxide-semiconductor field-effect-transistor (MOSFET) may be connected as a load to each stage of the VCO 140 and mode transition may be made by switching a signal used to control the operation of the MOSFET to vary the gain of the VCO 140. Furthermore, the type of the VCO 140 is not limited.

According to the present invention, since a VCO included in a PLL circuit may have a different gain according to mode transition, a wide operation frequency may be ensured in a high-gain mode, while phase noise characteristics may be improved in a low-gain mode.

Also, the PLL circuit may ensure a wide tuning range without increasing the number of capacitor banks, thereby preventing an increase in the designed area and improving the performance of the entire circuit.

In the drawings and specification, there have been disclosed typical preferred embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A phase-locked loop (PLL) circuit comprising:
   a phase frequency detector (PFD) configured to detect a phase difference between a reference signal and a PLL feedback signal;
   a charge pump and a loop filter configured to sequentially process an output signal of the PFD; and
   a voltage-controlled oscillator (VCO) configured to have different gains according to a mode transition,
   wherein a control voltage applied to the VCO is determined from an output signal of the loop filter in a first mode and from the output signal of the loop filter and an additional control signal in a second mode.

2. The PLL circuit of claim 1, wherein the mode transition is made after the PLL circuit is locked in the first mode.

3. The PLL circuit of claim 1, further comprising:
   an analog-to-digital converter (ADC) configured to convert the output signal of the loop filter into a digital signal; and
   a digital-to-analog converter (DAC) configured to convert the digital signal into an analog signal,
   wherein the additional control signal corresponds to the analog signal.

4. The PLL circuit of claim 3, further comprising a register configured to store the digital signal and provide the digital signal to the DAC.

5. The PLL circuit of claim 1, further comprising a switch configured to operate to cause the mode transition,
   wherein, in the first mode, the switch is in a first position to apply the output signal of the loop filter as the control voltage of the VCO, and, in the second mode, the switch is in a second position to apply the output signal of the loop filter and the additional control signal as the control voltage of the VCO.

6. The PLL circuit of claim 5, wherein the switch causes the mode transition from the first mode to the second mode after the PLL circuit is locked.

7. The PLL circuit of claim 1, wherein the VCO includes at least one device that exhibits different characteristics in response to the control voltage that varies according to the mode transition.

8. The PLL circuit of claim 7, wherein the at least one device comprises:
   at least one first device configured to receive the output signal of the loop filter as the control voltage irrespective of the mode transition; and
   at least one second device configured to receive the output signal of the loop filter or the additional control signal as the control voltage according to the mode transition.

9. The PLL circuit of claim 7, wherein the device includes one or more of a variable capacitor and a transistor.

10. The PLL circuit of claim 8, wherein each of the first and second devices includes one or more of a variable capacitor and a transistor.

11. The PLL circuit of claim 1, wherein the gain of the VCO corresponds to a variation in an oscillation frequency of the VCO relative to a variation in the output signal of the loop filter.

12. The PLL circuit of claim 7, wherein the gain of the VCO in the first mode is greater than the gain in the second mode.

13. The PLL circuit of claim 7, wherein a ratio of the gain in the first mode to the gain in the second mode is determined by the number of devices included in the VCO.

14. The PLL circuit of claim 1, wherein the first and second modes correspond to a coarse locking mode and a fine locking mode, respectively.

* * * * *